United States Patent
Graham et al.

(10) Patent No.: US 8,657,413 B2
(45) Date of Patent: Feb. 25, 2014

(54) DIE ATTACH COMPOSITION FOR SILICON CHIP PLACEMENT ON A FLAT SUBSTRATE HAVING IMPROVED THIXOTROPIC PROPERTIES

(75) Inventors: David Graham, Lexington, KY (US); Jeanne Marie Saldanha Singh, Lexington, KY (US); Richard D. Wells, Westerville, OH (US); Joel Provence, Delaware, OH (US)

(73) Assignee: Funai Electric Co., Ltd., Osaka (JP)

( * ) Notice: Subject to any disclaimer, the term of this patent is extended or adjusted under 35 U.S.C. 154(b) by 488 days.

(21) Appl. No.: 13/008,428

(22) Filed: Jan. 18, 2011

(65) Prior Publication Data
US 2012/0182355 A1    Jul. 19, 2012

(51) Int. Cl.
| | |
|---|---|
| *B41J 2/01* | (2006.01) |
| *C09J 163/02* | (2006.01) |
| *C09J 183/10* | (2006.01) |
| *H01L 21/00* | (2006.01) |
| *C08G 59/24* | (2006.01) |
| *C08G 59/30* | (2006.01) |
| *C08G 59/50* | (2006.01) |

(52) U.S. Cl.
USPC .............. 347/50; 156/329; 156/330; 347/20; 523/427; 523/428; 523/433; 523/466; 525/476; 525/524; 525/525

(58) Field of Classification Search
None
See application file for complete search history.

(56) References Cited

U.S. PATENT DOCUMENTS

| | | |
|---|---|---|
| 5,663,752 A | 9/1997 | Imamura et al. |
| 6,834,937 B2 | 12/2004 | Killmeier et al. |
| 7,766,455 B2 | 8/2010 | Graham et al. |
| 7,819,506 B2 | 10/2010 | Graham et al. |
| 2002/0126354 A1 | 9/2002 | Garrett |
| 2005/0018898 A1* | 1/2005 | White et al. ............. 382/145 |
| 2005/0231551 A1* | 10/2005 | Gibson et al. ............. 347/45 |
| 2006/0216520 A1 | 9/2006 | Osada |
| 2007/0236542 A1 | 10/2007 | Graham et al. |
| 2009/0255438 A1 | 10/2009 | Graham et al. |
| 2010/0210759 A1 | 8/2010 | Graham et al. |
| 2011/0014354 A1 | 1/2011 | Graham et al. |

OTHER PUBLICATIONS

MSDS for SIB1115.0, provided by Gelest, Inc (2008).*

* cited by examiner

*Primary Examiner* — Michael J Feely
(74) *Attorney, Agent, or Firm* — Amster, Rothstein & Ebenstein LLP

(57) ABSTRACT

A die attach composition is used for bonding a silicon chip on a flat substrate. The die attach composition includes a cross-linkable epoxy resin having a rigid backbone, an epoxy siloxane resin, a fumed silica filler, an amine curing agent, and a silane coupling agent. The die attach composition is particularly useful in bonding silicon heater chips on flat ceramic substrate in forming an inkjet printhead assembly. The die attach composition allows accurate placement of silicon heater chips on flat ceramic substrate and exhibits good ink resistance.

15 Claims, 6 Drawing Sheets

DIE ATTACH COMPOSITION FOR SILICON CHIP PLACEMENT ON A FLAT SUBSTRATE HAVING IMPROVED THIXOTROPIC PROPERTIES

BACKGROUND

1. Field of the Invention

The disclosure generally relates to a die attach composition used for bonding a silicon chip on a flat substrate, and more particularly, to a die attach composition providing accurate placement of heater chip on a flat ceramic substrate when manufacturing an inkjet printhead assembly.

2. Description of the Related Art

A printhead assembly, employed in an inkjet printer, generally includes a silicon chip used as a heater chip, a nozzle plate attached on the silicon chip, and a flexible circuit. The printhead assembly is typically formed by attaching the silicon heater chip with nozzle plate on a chip pocket of a printhead body using a die bond adhesive. The silicon heater chip is then connected to the flexible circuit using a technique commonly known as the tape automated bonding (TAB) technique. The printhead body may be a polymeric material such as a modified phenylene oxide.

Alternatively, the printhead assembly may also be formed by separately attaching the flexible circuit and silicon heater chip with nozzle plate on a flat substrate such as a flat ceramic substrate instead of on the chip pocket of the printhead body. The heater chips are then connected to the flexible circuit through wire bonding technique instead of using the TAB technique. The silicon heater chip is attached on the flat ceramic substrate by disposing die bond adhesive on the flat ceramic substrate, placing the silicon heater chip over the disposed die bond adhesive without any support from the TAB circuit, and then curing the die bond adhesive.

This above-described alternate way of forming a printhead assembly using a flat ceramic substrate presents a problem because there is no TAB circuit for the heater chip to rest upon. The absence of the TAB circuit causes the silicon heater chip to shift position after the die bond adhesive is cured, obviously leading to a faulty printhead assembly. Thus, there is a need for a die attach composition having improved thixotropic properties to provide accurate placement of silicon chips on flat substrate, especially a ceramic substrate.

There are many commercially known die attach adhesive which can accurately bond and position silicon chips on flat substrate, However, these adhesives tend to wick and easily wear upon exposure to aqueous fluid or ink. In the construction of printhead assembly of an inkjet printer, it is desirable to employ a die attach composition having improved thixotropic properties to provide accurate placement of heater chips on flat ceramic substrate while also possessing good ink resistance.

In pending patent application U.S. patent application Ser. No. 12/103,307 assigned Lexmark International, Inc, there is disclosed an encapsulant composition comprising from about 1.5 to about 95 percent by weight of one or more cross-linkable epoxy resins having rigid backbone and about 0.1 to about 35 percent by weight of one or more thermal curative agents. This prior art encapsulant composition exhibits a rigid and strong adherence to the surfaces of the printhead of an inkjet printer and a high ink resistance when the silicon heater chip is connected to the flexible circuit using the TAB technique. However, this prior art encapsulant composition cannot be used as die attach adhesive when the printhead includes a flat ceramic or plastic substrate because the silicon heater chip does not position correctly on the flat substrate after the curing process. The absence of the TAB circuit causes the silicon heater chip to shift position after the die bond adhesive is cured. This misalignment of the heater chip and the flat substrate leads to a faulty printhead assembly.

In the present invention, this prior art encapsulant composition is modified to have surprisingly improved thixotropic properties and provide a die attach composition which allows accurate placement of silicon chips on flat ceramic substrate while also exhibiting high ink resistance. This provides a printhead assembly having all its components properly aligned on the flat ceramic substrate, therefore leading inkjet printers having good print quality.

SUMMARY

The present disclosure provides a die attach composition having improved thixotropic properties and high resistance to aqueous fluid. The die attach composition includes a cross-linkable epoxy resin having a rigid backbone, an epoxy siloxane resin, a fumed silica filler, an amine curing agent, and a silane coupling agent.

Another embodiment of the present disclosure is a method of positioning a silicon chip on a flat substrate using the die attach composition.

Further embodiment of the present disclosure, is a printhead assembly employing the die attach composition to ensure proper alignment of the printhead components on flat ceramic substrate and avoid issues on print quality of inkjet printers.

Features and advantages of the present disclosure will be more understood through the detailed description and in reference to the figures which follow.

DETAILED DESCRIPTION

It is to be understood that various omissions and substitutions of equivalents are contemplated as circumstances may suggest or render expedient, but these are intended to cover the application or implementation without departing from the spirit or scope of the claims of the present disclosure. It is to be understood that the present disclosure is not limited in its application to the printhead assembly set forth in the following description. The present disclosure is capable of other embodiments and of being used in various applications. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the terms "a" and "an" herein do not denote a limitation of quantity, but rather denote the presence of at least one of the referenced item.

The present disclosure provides a die attach composition having improved thixotropic properties and high ink resistance to aqueous fluid. The die attach composition includes a cross-linkable epoxy resin or group of resins having a rigid backbone, an epoxy siloxane resin, a fumed silica filler, an amine curing agent, and a silane coupling agent.

The cross-linkable epoxy resin having rigid backbone may comprise epoxidized bisphenol F (commercially available under trade name, 'EXA 830 LVP' from Dainippon Ink to and Chemicals Inc., Japan), epoxidized bisphenol A (commercially available under trade name, 'EXA 850 CRP' from Dainippon Ink and Chemicals Inc., Japan), or combinations thereof. The die attach composition should preferably includes from about 40 to about 50 percent by weight of epoxidized bisphenol F and from about 2.5 to about 7.5 percent by weight of epoxidized bisphenol A. More preferably, the die attach composition should include about 46.3 percent by weight of epoxidized bisphenol F and about 5.2 percent by weight of epoxidized bisphenol A.

As a modification of the encapsulant composition disclosed in U.S. patent application Ser. No. 12/103,307, epoxy siloxane is added to provide a die attach composition having improved thixotropic properties. Such epoxy siloxane resin comprises diepoxide structure having siloxane bond. Suitable example of such epoxy siloxane resin is 1,3-bis(glycidoxypropyl)tetramethyl disiloxane (commercially available under trade designation, 'SIB 1115.0' from Gelest, Inc.).

Figure 1:
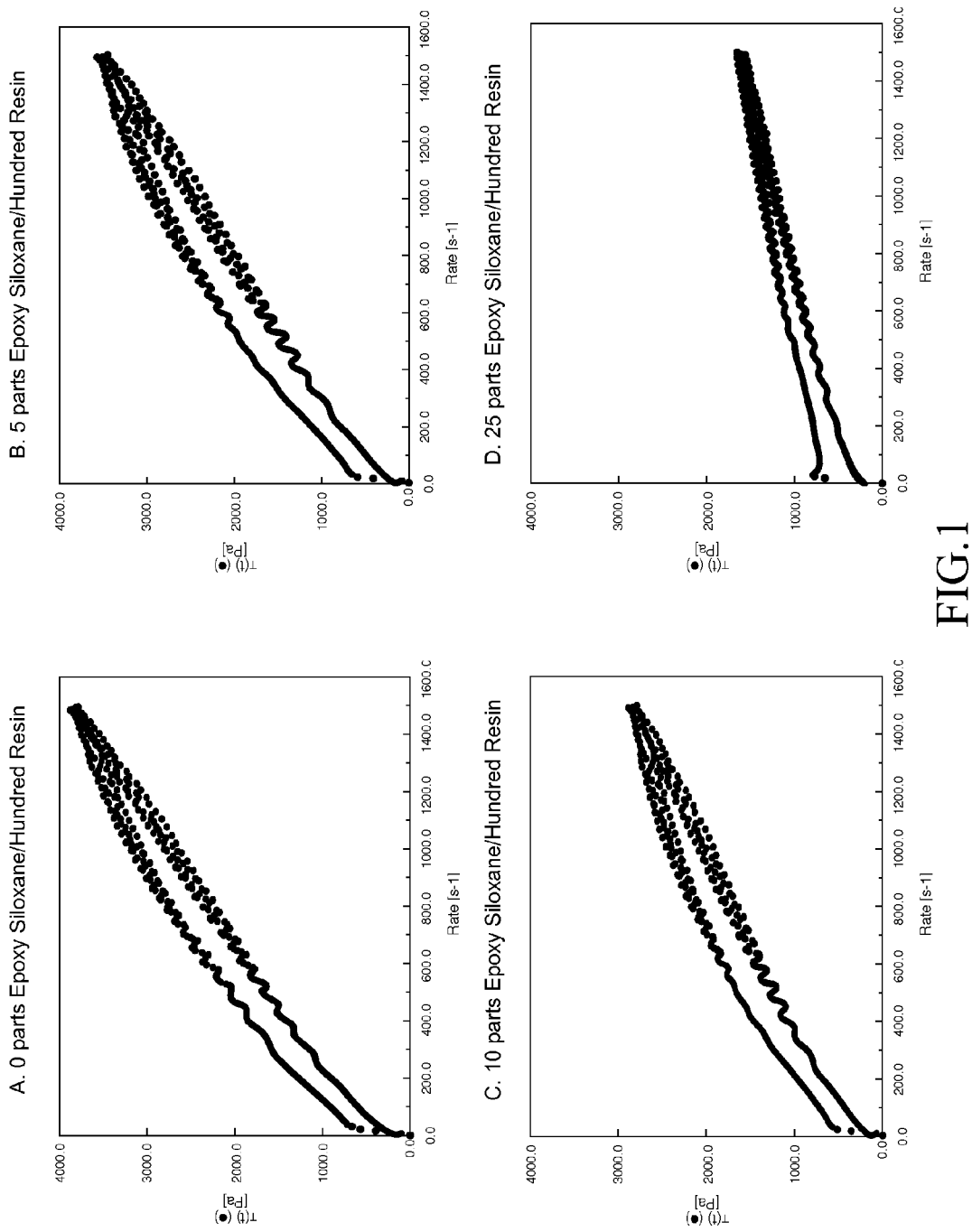
FIGS. 1A-1D are graphical illustrations of thixotropic behavior of die attach to composition at different epoxy siloxane loading.

FIGS. 1A-1D illustrates thixotropic behavior of the encapsulant composition upon modification with epoxy siloxane, more specifically the thixotropic loop formed by the composition at different loading of epoxy siloxane. FIG. 1A shows the thixotropic loop formed by the encapsulant composition disclosed in U.S. patent application Ser. No. 12/103,307. FIGS. 1B-1D shows the thixotropic loop of the encapsulant composition modified with epoxy siloxane respectively at amount of 5, 10 and 25 parts per hundred resin, or at amount of 4, 7.65 and 17.15 percent by weight of the die attach composition. Thixotropic loop represents the deformation history of the composition upon application and removal of shear load. Such deformation is measured in terms of viscosity or stress. The thixotropic loop area minimizes upon addition of the epoxy siloxane. Such reduction of thixotropic loop area indicates that less time is required by the composition to recover from the deformation. In the present invention, a die attach composition requiring less time to recover from deformation is desirable. Therefore, the epoxy siloxane resin should be added in an amount equal to or above 20 parts per hundred resin or 14.2 percent by weight of the die attach composition. More preferably, the epoxy siloxane resin should be included in an amount from about 14 to about 30 percent by weight of the die attach composition. Most preferably, the epoxy siloxane should be included in an amount of 25 parts per hundred resin or 17.15 percent by weight of the die attach composition to achieve the desired thixotropic properties of the die attach composition.

Suitable example of fumed silica filler is amorphous fumed silica commercially available under trade name, 'TS-720' (obtained from Cabot Corporation). However, it may be understood that any other fumed silica filler that is compatible with cross-linkable epoxy resin and epoxy siloxane resin and imparts the aforementioned properties of die attach composition, may be employed to serve the purpose of the present disclosure. The fumed silica filler should be used in an amount of less than or equal to about 10% by weight of the die attach composition. More preferably, the fumed silica filler should be included in an amount from about 0.01 to about 10 percent by weight of the die attach composition. Most preferably, the fumed silica filler should be included in an amount of about 4.29 percent by weight of the die attach composition.

The amine curing agent includes at least one solid amine suitable for thermal curing. More specifically, a solid amine having melt temperature of less than or equal to about 65° C., such as amine adduct commercially available under trade name, 'Ancamine 2337S' (obtained from Air Products Inc.). Solid amines with melt temperature of about 100° C. may also be used, such as amine adduct commercially available under trade name, 'Ancamine 2014' (obtained from Air Products Inc.). The amine curing agent should be used in an amount of from about 0.1 to about 35 percent by weight of the die attach composition. More preferably, the die attach composition should include from about 10 to about 13 percent by weight of Ancamine 2337S and from about 8 to about 18 percent by weight of Ancamine 2014FG. Most preferably, the die attach composition should include about 10.3 percent by weight of Ancamine 2337S and about 15.6 percent by weight of Ancamine 2014FG.

The silane coupling agent provides a chemical bridge between the resins and any substance or material on which it may be adhered. Example of such silane coupling agent includes an epoxy silane coupling agent. A commercially available silane coupling agent is sold by Gelest, Inc. under the trade name SIG 5840. However, it may be understood that any other coupling agent that is compatible with the cross-linkable epoxy resin and the epoxy siloxane resin, and is capable of imparting the aforementioned properties to the die attach composition may be employed to serve the purpose of the present disclosure. The silane coupling agent is used in an amount of less than or equal to about 1 percent by weight of the die attach composition. Most preferably, the silane coupling agent should be used in an to amount of 1 percent by weight of the die attach composition.

The die attach composition optionally includes a fluorescent pigment. The fluorescent pigment provides an alternative failure analysis method as described in pending patent application U.S. patent application Ser. No. 12/505,577 assigned Lexmark International, Inc. The die attach composition may include fluorescent pigment in an amount from about 0.1 to about 1.0 percent by weight. More preferably, the die attach composition may include fluorescent pigment in an amount of about 0.17 percent by weight of the die attach composition or about 0.25 parts per hundred resin.

In another embodiment of the present disclosure, there is provided a method of positioning a silicon chip on a flat substrate using the die attach composition of the present disclosure. The silicon chip may be an electronic component or a semiconductor chip. The flat substrate may comprise ceramic or plastic substrate. Such flat plastic substrate include, but are not limited to, glass filled plastics, liquid crystal polymer plastic or NORYL plastic. The method includes disposing the die attach composition on the flat substrate, placing the silicon chip above the disposed die attach composition, and thermally curing.

In further embodiment of the present disclosure, there is provided a printhead assembly employing the die attach composition of the present disclosure. The printhead assembly includes a flat ceramic substrate having at least one portion with plurality of vias, flexible circuit attached to the flat ceramic substrate, one or more heater chips positioned on the flat ceramic substrate through the die attach composition, and wire bonds providing electrical connections between the heater chips and the flexible circuit.

Figure 2:
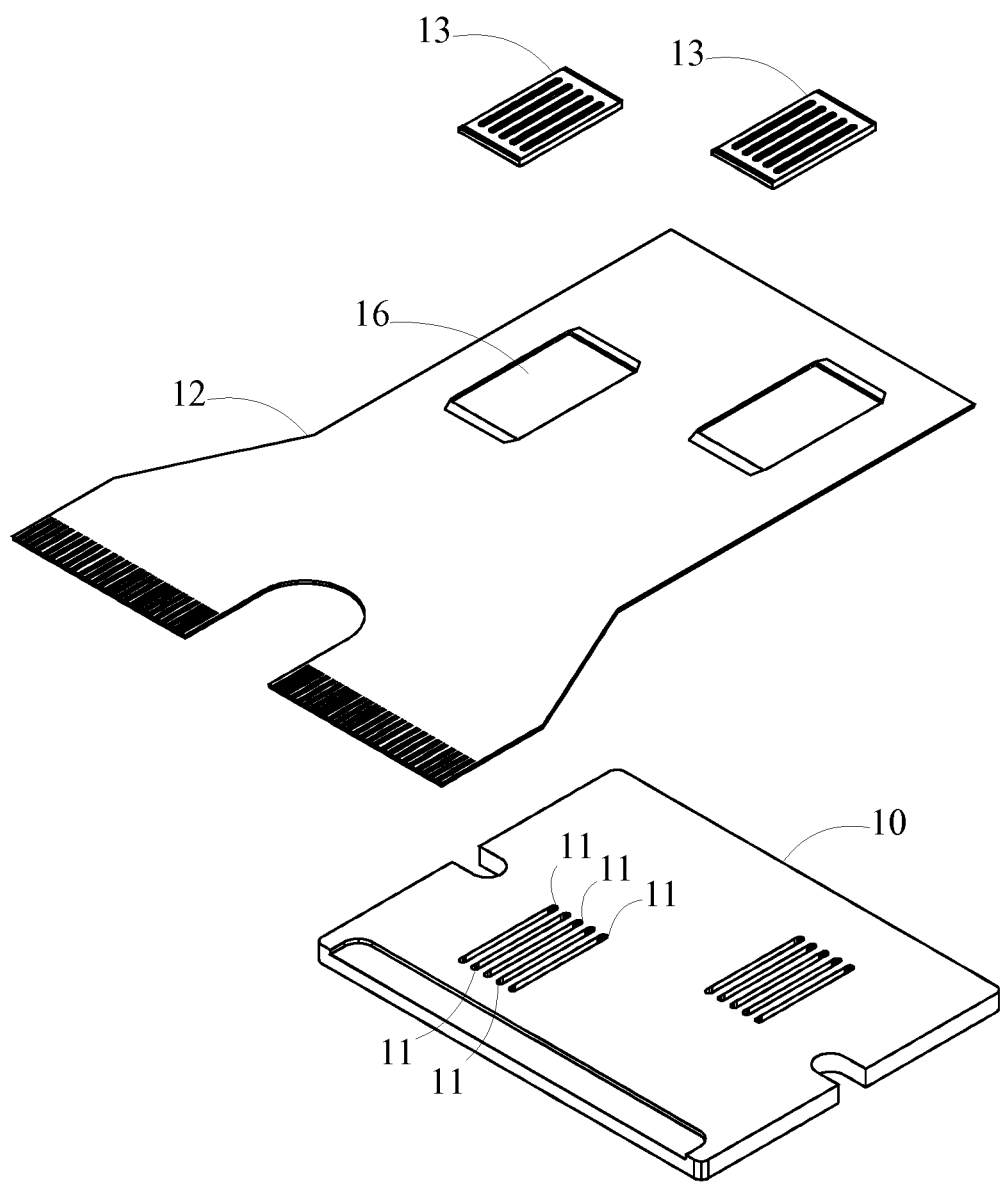
FIG. 2 is a perspective view, not to scale, of a printhead assembly according to embodiment of the present disclosure.

FIG. 2 illustrates a perspective view of the components of the printhead assembly according to an embodiment of the present disclosure. The flat ceramic substrate 10 has two portions with plurality of vias 11. The flexible circuit 12 has two open portions 16 to be aligned with the two portions of the flat ceramic substrate 10 having plurality of vias 11. There are two heater chips 13 to be positioned on the flat ceramic substrate 10. Each heater chip 13 includes a nozzle plate such as a photoimageable nozzle plate on the top portion and leaving the bottom portion for attachment with the flat ceramic substrate 10.

Figure 3A:
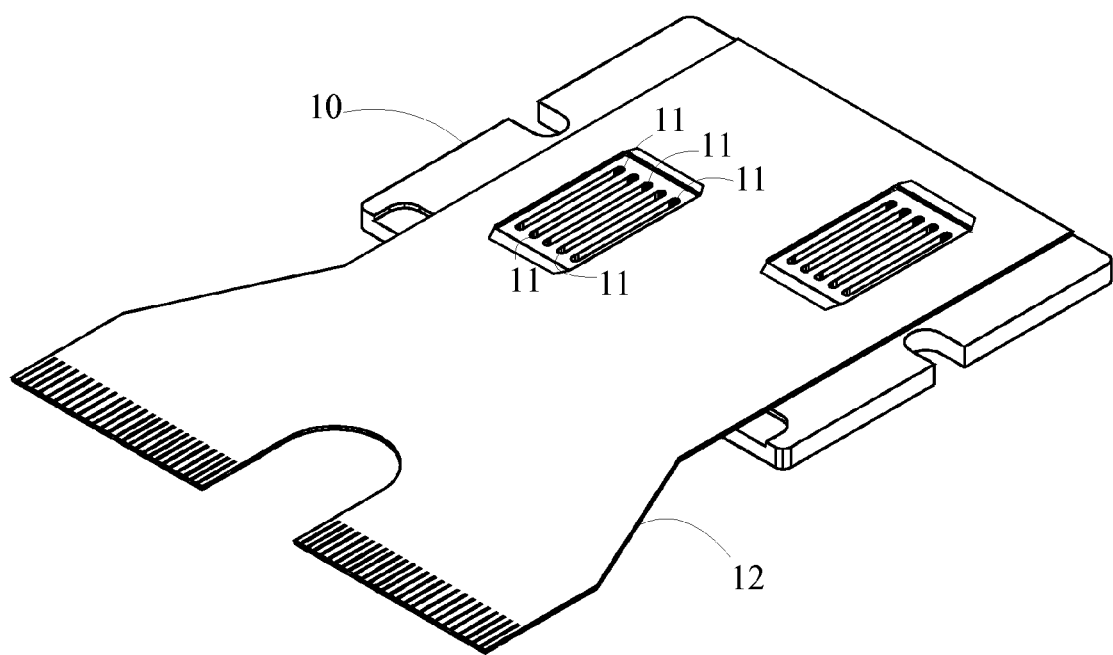
FIG. 3A is a perspective view of flat ceramic substrate with flexible circuit upon construction of printhead assembly according to embodiment of the present disclosure.
Figure 3B:
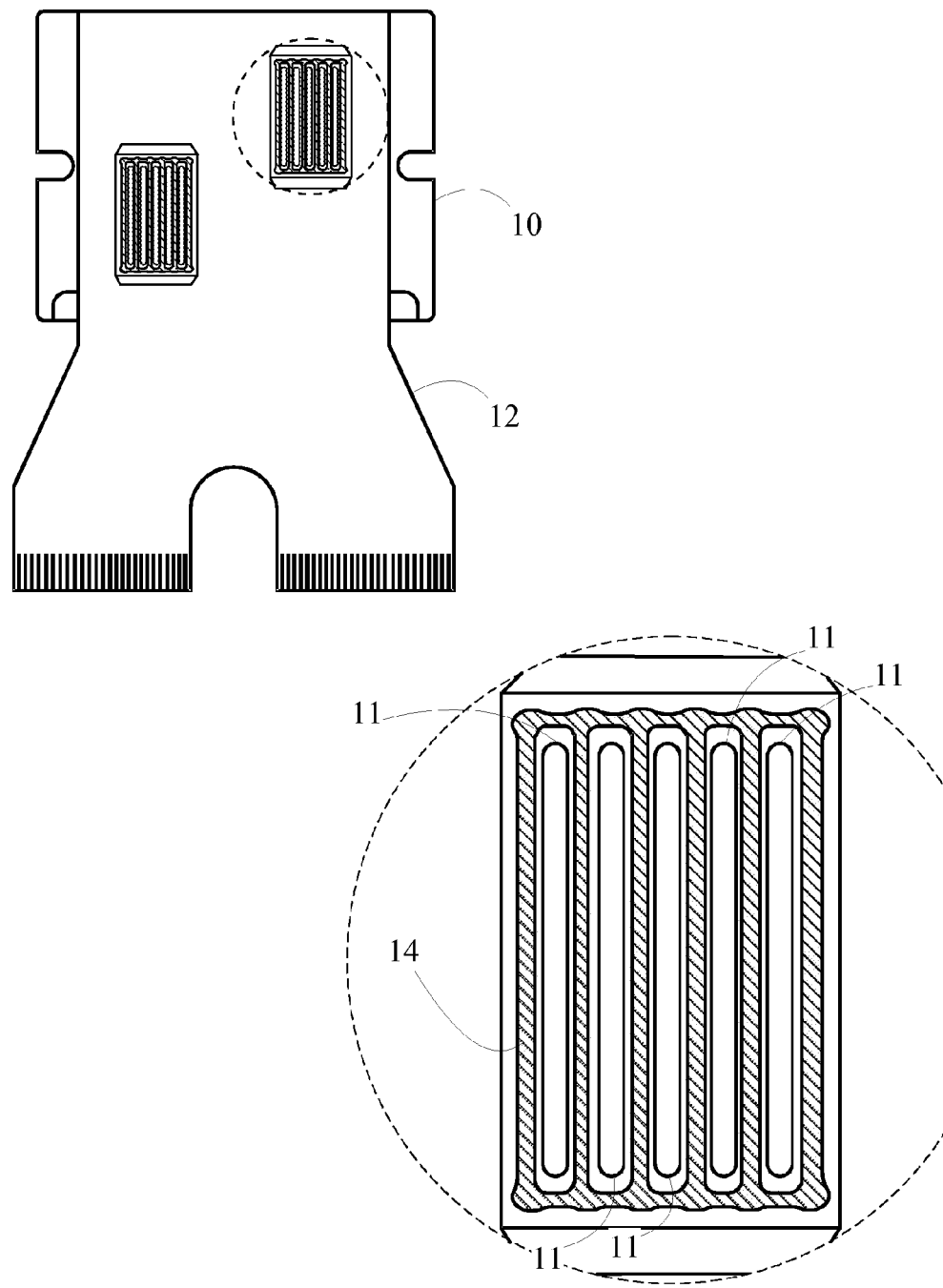
FIG. 3B is a top view of flat ceramic substrate upon formation of printhead assembly according to embodiment of the present disclosure.
Figure 3C:
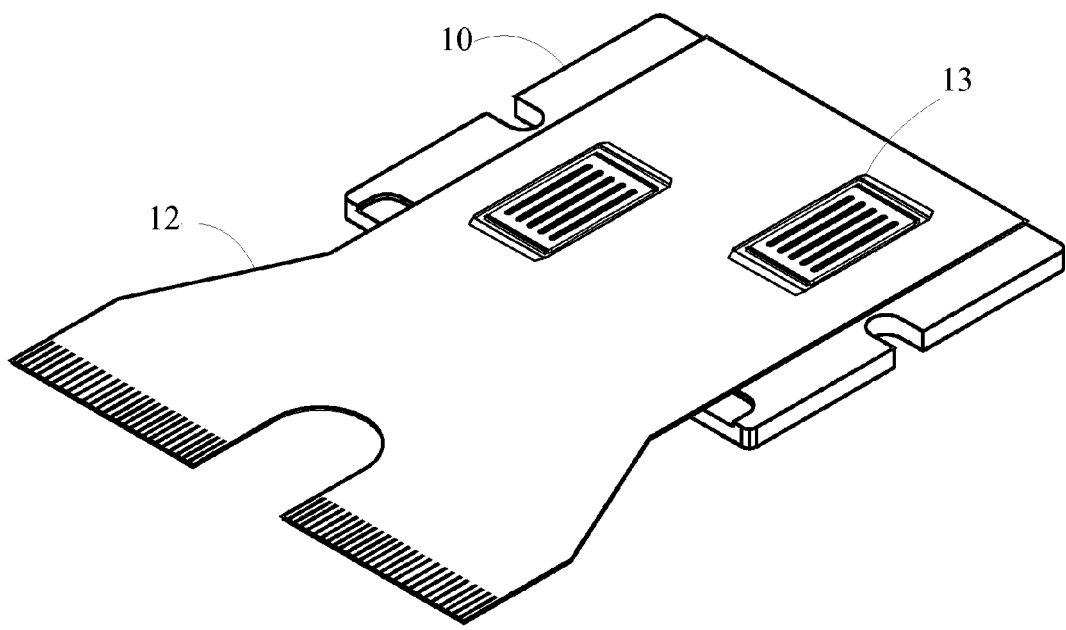
FIGS. 3C-3D are perspective views of printhead assembly upon construction according to embodiment of the present disclosure.

In the construction of the printhead assembly and with reference to FIG. 3A, the flexible circuit 12 is attached on the flat ceramic substrate 10 using an adhesive, in a manner to in which the two open portions of the flexible circuit 12 are aligned with the two portions of the flat ceramic substrate 10 having plurality of vias 11. With reference to FIG. 3B, die attach composition 14 is disposed on portions of the flat ceramic substrate 10 surrounding each of the vias 11. With reference to FIG. 3C, the heater chips 13 are positioned in such a way that the vias of the flat ceramic substrate 10 are aligned with the nozzle plate positioned on top of the heater chip 13. The flat ceramic substrate 10 attached with flexible circuit 12 and positioned with heater chips 13 is heated to cure the die attach composition. Once the die attach composition cures, the flexible circuit 12 and the two heater chips 13 are fixed relative to each other at the adhering points of the flat ceramic substrate 10.

Figure 3D:
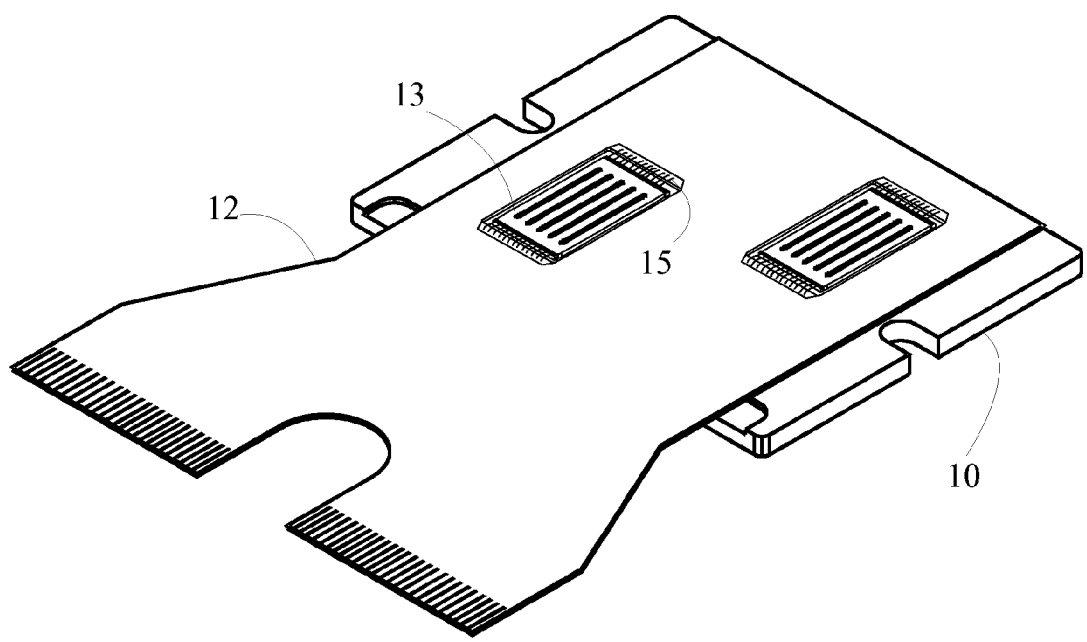

FIG. 3D shows a perspective view of the printhead assembly. The die attach composition, having improved thixotropic properties, exhibits good dimensional stability that it does not flow through the vias of the flat ceramic substrate 10 upon placement of the heater chips 13. Also, it does not allow the heater chips 13 to shift position after curing and in further processing. The heater chips 13 are accurately fixed on the flat ceramic substrate 10, in such a way that its location is easily determined relative to the flexible circuit 12 upon wire bonding. The heater chips are then electrically connected with the flexible circuit through wire bonds 15.

Further, the die attach composition does not only bond and provide accurate positioning of the heater chips on the flat ceramic substrate but it also serve as fluid sealant. For the purpose of this description, the fluid used herein is ink. The ink may include any color such as black color ink, cyan color ink, magenta color ink, yellow color ink, or combinations thereof. Inks with different color may flow through the plurality of vias of the flat ceramic substrate and into the heater chips for ejection through the nozzle plate. The use of die attach composition, having high resistance to aqueous fluid such as ink, prevents ink leakage in between the plurality of vias.

The present disclosure will be more readily appreciated with reference to the example which follows.

In the following example, a die attach composition of the present invention was evaluated for different properties and performance thereof. It is to be understood that this die attach composition and the evaluation results described herein provide an example illustration of the present disclosure and should not be construed as a limitation of the present disclosure.

Table 1 shows components of an example die attach composition. It is to be to understood that the components of the die attach composition could be at any concentration covered within the ranges specified in Table 1.

TABLE 1

| Component | Material | Concentration Range (percent by weight) | Trade Name | Supplier |
|---|---|---|---|---|
| Cross-linkable Epoxy Resin | Epoxidized bisphenol F | 40.0-50.0 | EXA 830 LVP | Dainippon Ink and Chemicals Inc. |
| | Epoxidized bisphenol A | 2.5-7.5 | EXA 850 CRP | Dainippon Ink and Chemicals Inc. |
| Epoxy Siloxane Resin | 1,3-bis(glycidoxypropyl) tetramethyl disiloxane | 15.0-20.0 | SIB1115.0 | Gelest |
| Thermal Curing Agent | Amine adduct 1 in phenol | 10.0-13.0 | ANCAMINE 2337S | Air Products and Chemical Inc. |
| | Amine adduct 2 in phenolic resin | 8.0-18.0 | ANCAMINE 2014FG | Air Products and Chemical Inc. |
| Silane Coupling agent | Epoxy silane | Less than 1.0 | SIG5840 | Gelest |
| Filler | Fumed silica | Less than 5.0 | TS-720 | Cabot Corporation |
| Pigment | Fluorescent pigment | 0.1-1.0 | UVITEX OB | Ciba |

A more preferable concentration of the components of the die attach composition of the present disclosure is presented in Table 2. This die attach composition shown in Table 2, may hereinafter referred to as 'Die Attach Composition I'.

TABLE 2

| Component | Material | Concentration Range (percent by weight) | Trade Name | Supplier |
|---|---|---|---|---|
| Cross-linkable Epoxy Resin | Epoxidized bisphenol F | 46.3 | EXA 830 LVP | Dainippon Ink and Chemicals Inc. |
| | Epoxidized bisphenol A | 5.2 | EXA 850 CRP | Dainippon Ink and Chemicals Inc. |
| Epoxy Siloxane Resin | 1,3-bis(glycidoxypropyl) tetramethyl disiloxane | 17.15 | SIB1115.0 | Gelest |
| Thermal Curing Agent | Amine adduct 1 in phenol | 10.3 | ANCAMINE 2337S | Air Products and Chemical Inc. |

TABLE 2-continued

| Component | Material | Concentration Range (percent by weight) | Trade Name | Supplier |
|---|---|---|---|---|
| | Amine adduct 2 in phenolic resin | 15.6 | ANCAMINE 2014FG | Air Products and Chemical Inc. |
| Silane Coupling agent | Epoxy silane | 1.0 | SIG5840 | Gelest |
| Filler | Fumed silica | 4.29 | TS-720 | Cabot Corporation |
| Pigment | Fluorescent pigment | 0.17 | UVITEX OB | Ciba |

The properties of Die Attach Composition I were monitored. These properties included glass transition temperature (Tg), storage modulus, Young's modulus, viscosity and thixotropic index. For experimental purposes, the viscosity was measured at low shearing speed of 1.9 sec$^{-1}$ and high shearing speed of 19 sec$^{-1}$ using TA Instruments ARES to Rheometer at a temperature of about 25° C. The storage modulus was measured using dynamic mechanical analysis (DMA) at a temperature of about 25° C. The glass transition temperature was also measured using DMA. It should be apparent to a person skilled in the art that, the term 'Young's modulus' used herein may be defined as the ratio of tensile stress to tensile strain, and the term 'thixotropic index' used herein may be defined as the ratio of viscosity at low shearing speed to viscosity at high shearing speed.

The properties of the Die Attach Composition I of Table 2 were analyzed and compared to the properties of a prior art encapsulant composition disclosed in U.S. patent application Ser. No. 12/103,307 and made available from Engineered Materials Systems, Inc. of Delaware, Ohio under trade name 'EMS 332-5-122'. It should be understood that the prior art encapsulant composition EMS 332-5-122 does not contain epoxy siloxane and may hereinafter be referred to as 'Composition without epoxy siloxane'. Results of a comparative analysis of the properties of the Composition without epoxy siloxane with the properties of the Die Attach Composition I of the present disclosure are shown in Table 3.

TABLE 3

| Properties | Composition without epoxy siloxane | Die Attach Composition I |
|---|---|---|
| Tg (° C.) | ≥90 | 89.6-91.6 |
| Storage Modulus (MPA) at 25° C. | ≥500 | 2050-2550 |
| Young's Modulus (MPa) | ≥1500 | 1300-1800 |
| Viscosity (cPs) at 1.9 sec$^{-1}$ | 129.9 | 117.91 |
| Viscosity (cPs) at 19 sec$^{-1}$ | 24.68 | 9.89 |
| Thixotropic Index | 5.26 | 11.92 |

In reference to Table 3, the Die Attach Composition I exhibits a glass transition temperature of about 89.6 to about 91.6° C., storage modulus of about 2050 to about 2550 MPa, and Young's modulus of about 1300 to about 1800 MPa, which are comparable relative to glass transition temperature, storage modulus and Young's modulus of the Composition without epoxy siloxane. In light of the aforementioned values of glass transition temperature, storage modulus and Young's modulus, it should be understood that both the Die Attach Composition I and Composition without epoxy siloxane exhibit good rigidity, high reversible deformation behavior and low deformation under shearing forces.

Most importantly, it may be seen that the Die Attach Composition I exhibits a higher thixotropic index in comparison to the Composition without epoxy siloxane. This high thixotropic index is due to the presence of epoxy siloxane in Die Attach Composition I. The die attach composition of the present disclosure may exhibits a viscosity of about 112300 to about 149700 cPs at low shearing speed of 1.9 sec$^{-1}$, viscosity of about 9400 to about 18400 at high shearing speed of 19 sec$^{-1}$, and corresponding thixotropic index of about 7.7 to about 12.3. It should be understood that die attach compositions, such as the Die Attach Composition I, of the present disclosure may exhibit a thixotropic index of greater than or equal to about 6 with viscosities measured at low shearing speed of 1.9 sec$^{-1}$ and high shearing speed of 19 sec$^{-1}$.

Further, the Die Attach Composition I was evaluated for use in printhead assembly, such as printhead assembly of FIG. 3D. More specifically, the evaluation was carried out to analyze the performance of Die Attach Composition I relative to the Composition without epoxy siloxane when used for attaching heater chips on flat ceramic substrate in the construction of printhead assembly. Results of a comparative analysis of the performance of the Composition without epoxy siloxane with the performance of the Die Attach Composition I of the present disclosure are shown in Table 4.

TABLE 4

| Performance | Composition without epoxy siloxane | Die Attach Composition I |
|---|---|---|
| Bond line control (25 μm) | fair | good |
| Die-to-die parallelism | poor | good |
| Wicking issue | no | no |
| Ink resistance | excellent | good |

In the construction of printhead assembly, both the Die Attach Composition I and Composition without epoxy siloxane can be cured at 110° C. for 1 hour with bond line controlled at 25 μm. The Die Attach Composition I provides better bond line control in comparison to Composition without epoxy siloxane.

Parallelism of the two silicon heater chips attached on the flat ceramic substrate was determined through a video measurement system such as View Pinnacle 250. Eight printhead assemblies formed using the Composition without epoxy siloxane, and six printhead assemblies formed using the Die Attach Composition I, were sampled for die-to-die parallelism test. In reference to FIG. 3D, the left silicon heater chip was taken as the first chip and the right silicon heater chip was taken as the second chip. The surface of the silicon heater chip attached with nozzle plate is taken as the XY plane with X being the width direction of the silicon heater chip, Y being the length direction of the silicon heater chip, and Z being orthogonal to the nozzle plate surface. The distance of the center points of the two heater chips, hereinafter referred to as $Y_D$, was measured along the Y coordinate of the first chip which serves as the reference chip. The difference of the measured $Y_D$ relative to the ideal distance of the center points of the two heater chips was calculated and presented in Table 4 as $Y_{Error}$. The skewness of the second chip relative to the Y coordinate of the reference chip was also measured as the angular deviation of the Y coordinate of the second to chip relative to the Y coordinate of the reference chip as it rotates about the Z coordinate. This skewness of the second chip relative to the Y coordinate of the reference chip is presented in Table 5 as Theta.

TABLE 5

| Bond Type | Sample Printhead Assembly | $Y_{Error}$ (micron) | Absolute $Y_{Error}$ (micron) | Theta (degrees) | Absolute Theta (degrees) |
|---|---|---|---|---|---|
| EMS 332-5-122 | Assembly 1 | 0.00333 | 0.00333 | 0.0137 | 0.0137 |
|  | Assembly 2 | −0.00248 | 0.00248 | 0.0136 | 0.0136 |
|  | Assembly 3 | −0.00132 | 0.00132 | 0.01995 | 0.01995 |
|  | Assembly 4 | −0.00685 | 0.00685 | −0.13204 | 0.13204 |
|  | Assembly 5 | 0.00289 | 0.00289 | −0.02041 | 0.02041 |
|  | Assembly 6 | −0.00166 | 0.00166 | −0.00198 | 0.00198 |
|  | Assembly 7 | −0.00315 | 0.00315 | 0.02156 | 0.02156 |
|  | Assembly 8 | −0.01103 | 0.01103 | −0.01747 | 0.01747 |
|  | AVERAGE |  | 0.00409 |  | 0.03009 |
| Die Attach Composition I | Assembly 1' | −0.0003 | 0.0003 | −0.00274 | 0.00274 |
|  | Assembly 2' | −0.00265 | 0.00265 | 0.00673 | 0.00673 |
|  | Assembly 3' | −0.00181 | 0.00181 | −0.00066 | 0.00066 |
|  | Assembly 4' | −0.00076 | 0.00076 | 0.00661 | 0.00661 |
|  | Assembly 5' | −0.00149 | 0.00149 | 0.00281 | 0.00281 |
|  | Assembly 6' | −0.00271 | 0.00271 | 0.00269 | 0.00269 |
|  | AVERAGE |  | 0.00162 |  | 0.00371 |

As shown in Table 5 and as represented by the average values of $Y_{Error}$ and Theta, the use of Die Attach Composition I in forming the printhead assembly reduces the $Y_{Error}$ by more than 60% and chip skewness by more than 80% relative to that when a Composition without epoxy siloxane is used as die bond adhesive. The Die Attach Composition I has improved the attachment and positioning of the two heater chips on the flat ceramic substrate. Thus a good and better die-to-die parallelism is observed with Die Attach Composition I in comparison with the Composition without epoxy siloxane which provides poor die-to-die parallelism between the two silicon heater chips attached on the flat ceramic substrate.

Both the Die Attach Composition I and Composition without epoxy siloxane have no wicking issue. As the final printhead assemblies being constructed were inspected, there were no die bonds found along the vias of the flat ceramic substrate and nozzles of the silicon heater chips. The Die Attach Composition I also has good ink resistance.

Accordingly, the present disclosure provides a die attach composition having improved thixotropic properties and with good ink resistance. In reference to Table 3 and FIG. 1, the addition of the epoxy siloxane increases the thixotropic index of the composition and allows the die attach composition to recover fast from deformation due to shear, as seen by the decrease of thixotropic loop area presented in FIG. 1D. The epoxy siloxane makes a good combination with fumed silica filler which is also known as efficient thixotropic agent, in improving the thixotropic properties of the die attach composition. Thus, the die attach composition having improved thixotropic properties allows proper placement of silicon chips on flat ceramic substrate.

It is contemplated, and will be clear to those skilled in the art that modifications and/or changes may be made to the embodiments of the disclosure. Accordingly, the foregoing description and the accompanying drawings are intended to be illustrative of the example embodiments only and not limiting thereto, in which the true spirit and scope of the present disclosure is determined by reference to the appended claims.

What is claimed is:

1. A die attach composition comprising:
    a cross-linkable epoxy resin having a rigid backbone and including epoxidized bisphenol A present at an amount from about 2.5 percent to about 7.5 percent by weight of the die attach composition and epoxidized bisphenol F present at an amount from about 40 percent to about 50 percent by weight of the die attach composition;
    an epoxy siloxane resin present at an amount equal to or above 14.2 percent by weight of the die attach composition;
    a fumed silica filler present at an amount from about 0.01 to about 10 percent by weight of the die attach composition;
    an amine curing agent; and
    a silane coupling agent, wherein said die attach composition provides accurate placement of a heater chip on a flat substrate when manufacturing an inkjet printhead assembly.

2. The die attach composition of claim 1, wherein the epoxy siloxane resin comprises 1,3-bis(glycidoxypropyl)tetramethyl disiloxane.

3. The die attach composition of claim 1, wherein the epoxy siloxane resin is present at an amount from 14.2 to about 30 percent by weight of the die attach composition.

4. The die attach composition of claim 3, wherein the epoxy siloxane is present at an amount of about 17.15 percent by weight of the die attach composition.

5. The die attach composition of claim 1, wherein the fumed silica filler is present at an amount of about 0.1 to about 10 percent by weight of the die attach composition.

6. The die attach composition of claim 1, wherein the amine curing agent comprises an aliphatic amine curing agent.

7. The die attach composition of claim 6, wherein the aliphatic amine curing agent is present at an amount from about 0.1 to about 35 percent by weight of the die attach composition.

8. The die attach composition of claim 1, wherein the silane coupling agent comprises epoxy silane coupling agent.

9. The die attach composition of claim 1, wherein the silane coupling agent is present at an amount of less than or equal to about 1 percent by weight of the die attach composition.

10. The die attach composition of claim 1, further comprising a fluorescent pigment.

11. The die attach composition of claim 10, wherein the fluorescent pigment is present at an amount from about 0.1 to about 1 percent by weight of the die attach composition.

12. A method for positioning a silicon chip on a flat substrate, the method comprising:
    disposing a die attach composition on the flat substrate;
    placing the chip above the disposed die attach composition; and
    thermally curing the die attach composition, wherein the die attach composition comprises:
        a cross-linkable epoxy resin having a rigid backbone and including epoxidized bisphenol A present at an amount from about 2.5 percent to about 7.5 percent by weight of the die attach composition and epoxidized bisphenol F present at an amount from about 40 percent to about 50 percent by weight of the die attach composition, an epoxy siloxane resin present at an amount from about 14 to about 30 percent by weight of the die attach composition,
a fumed silica filler present at an amount from about 0.01 to about 10 percent by weight of the die attach composition,
an aliphatic amine curing agent; and
an epoxy silane coupling agent.

13. The method of claim 12, wherein the flat substrate comprises ceramic or plastic substrate.

14. The method of claim 12, wherein the die attach composition comprises a fluorescent pigment at an amount from about 0.1 to about 1 percent by weight of the die attach composition.

15. A printhead assembly comprising:
a flat ceramic substrate having at least one portion with plurality of vias,
a flexible circuit attached to the flat ceramic substrate,
at least one heater chip positioned on the flat ceramic substrate through a die attach composition, and
a plurality of wire bonds providing electrical connections between the heater chips and the flexible circuit,
wherein the die attach composition comprises:
a cross-linkable epoxy resin having a rigid backbone and including epoxidized bisphenol A present at an amount from about 2.5 percent to about 7.5 percent by weight of the die attach composition and epoxidized bisphenol F present at an amount from about 40 percent to about 50 percent by weight of the die attach composition,
an epoxy siloxane resin present at amount of from about 15 to about 30 percent by weight of the die attach composition,
an amorphous silica filler present at amount of from about 0.01 to about 10 percent by weight of the die attach composition,
an aliphatic amine curing agent; and
an epoxy silane coupling agent.

* * * * *